US012682969B2

(12) United States Patent　　　　(10) Patent No.:　US 12,682,969 B2
Chang　　　　　　　　　　　　　　　　(45) Date of Patent:　　　Jul. 14, 2026

(54) ONE-TIME PROGRAMMABLE (OTP) ARRAYS WITH METAL-SEMICONDUCTOR-METAL (MSM) SELECTORS FOR INTEGRATED CIRCUITRY

(71) Applicant: Intel Corporation, Santa Clara, CA (US)

(72) Inventor: Yao-Feng Chang, Flagstaff, AZ (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 17/878,796

(22) Filed: Aug. 1, 2022

(65) Prior Publication Data

US 2024/0038314 A1　　Feb. 1, 2024

(51) Int. Cl.
| | |
|---|---|
| *G11C 17/16* | (2006.01) |
| *G11C 17/18* | (2006.01) |
| *H10B 20/25* | (2023.01) |
| *H10B 99/00* | (2023.01) |
| *H10W 20/49* | (2026.01) |

(52) U.S. Cl.
CPC .............. *G11C 17/16* (2013.01); *G11C 17/18* (2013.01); *H10B 20/25* (2023.02); *H10B 99/00* (2023.02); *H10W 20/493* (2026.01)

(58) Field of Classification Search
CPC ................................. G11C 17/16; H10B 99/00
USPC ....................................................... 365/225.7
See application file for complete search history.

(56) References Cited

U.S. PATENT DOCUMENTS

| | | | |
|---|---|---|---|
| 2012/0008367 A1* | 1/2012 | Kajiyama | .......... G11C 13/0007 |
| | | | 365/148 |
| 2012/0044738 A1* | 2/2012 | Chung | ................... H10B 61/10 |
| | | | 365/96 |

(Continued)

OTHER PUBLICATIONS

Chen, Zhanping, et al., "A 0.9-um*2 1T1R Bit Cell in 14-nm High-Density Metal Fuse Technology for High-Volume Manufacturing and In-Field Programming", IEEE Journal of Solid-State Circuits, vol. 52, No. 4, Apr. 2017, 7 pgs.*

(Continued)

*Primary Examiner* — Muna A Techane
(74) *Attorney, Agent, or Firm* — Essential Patents Group, LLP

(57)　　　　　　　ABSTRACT

One-time programmable (OTP) bit-cell for an integrated circuit (IC) that includes an OTP element, such as a fuse or antifuse, coupled in electrical series with a selector that comprises a Schottky junction. The selector may comprise a metal-semiconductor-metal (MSM) material stack operable as transient voltage suppression (TVS) device that experiences electrical breakdown at a voltage below a programming voltage of the OTP element. In response to a programming voltage, the MSM stack may breakdown and pass a transient current sufficient for programming the OTP element. In response to a lower (e.g., read) voltage, the MSM stack may breakdown and pass a transient current insufficient for programming, but sufficient to sense a state of the OTP element. In response to an even lower (e.g., half-read) voltage, the MSM stack may present a very high OTP bit-cell input impedance, reducing leakage and/or sneak path currents within an array of such bit-cells.

17 Claims, 13 Drawing Sheets

(56) References Cited

U.S. PATENT DOCUMENTS

| | | | |
|---|---|---|---|
| 2016/0351498 A1* | 12/2016 | Chang ..................... | H01L 23/62 |
| 2022/0262420 A1* | 8/2022 | Yokoyama ............. | H10N 70/00 |

OTHER PUBLICATIONS

Hsieh, Cheng-Chih, et al., "Highly Non-linear and Reliable Amorphous Silicon Based Back-to-Back Schottky Diode as Selector Device for Large Scale RRAM Arrays", ECS Journal of Solid State Science and Technology, 6 (9) N143-N147 (2017), 6 pgs.*

* cited by examiner

303

303

1

ONE-TIME PROGRAMMABLE (OTP) ARRAYS WITH METAL-SEMICONDUCTOR-METAL (MSM) SELECTORS FOR INTEGRATED CIRCUITRY

BACKGROUND

Integrated circuit (IC) devices often comprise one-time programmable (OTP) read-only memory (ROM, or PROM), which continues to be a key technology among embedded memory categories. Various product applications, such as reconfigurable ROM, root-of-trust implementations (memory redundancy), on-chip security keys, and unit-level-traceability rely on a high-density OTP ROM offering reliable, available, and affordable information storage. Electrical-fuse (eFuse) and anti-fuse (AF) are the two most prevalent OTP element architectures for implementing OTP ROM arrays embedded within an IC device.

An electrical fuse is a sacrificial electrical device that initially provides a conductive/low electrical resistance path between two circuit nodes until an electrical current passed across the device exceeds a threshold level, which induces a permanent/irreversible high resistance/non-conductive open circuit. FIG. 1A is a circuit schematic of a fuse bit cell 101. Fuse bit cell 101 includes an access transistor (e.g., MOSFET) 102 between a voltage source and a first fuse electrode 110. Fuse electrode 110 is coupled to a second fuse electrode 111 through a resistor 103. Fuse electrode 111 is further coupled to a reference voltage, which is ground in this example. During a programming of bit-cell 101, access transistor 102 is enabled with a control gate voltage, which applies a program voltage to fuse electrode 110. When the program voltage is dropped across terminals of antifuse 201, Joule heating and/or electromigration occurs within resistor 103 causing resistor 103 to physically degrade into an open circuit.

FIG. 1B is a plan view of an interconnect line fuse 105, implementing fuse bit cell 101, in accordance with convention. An area of a dielectric material 108 is covered by an interconnect metallization trace or line 120 spanning a distance between two adjacent contacts 130. Interconnect trace or line 120, operable as resistor 103 (FIG. 1A), may be of any conductive material, such one or more metals employed for interconnect metallization. Interconnect trace or line 120 is patterned to have a longitudinal length $L_1$, which may vary to accommodate a minimum pitch of contacts 130. Interconnect trace or line 120 also has a minimum transverse width $W_1$. Fuse programming current requirements correspond to a cross-sectional area of interconnect trace or line 120 and is therefore a function of minimum transverse width $W_1$, which may be varied along with interconnect line thickness to set the fuse programming voltage threshold.

An antifuse is an electrical device that initially has a high resistance between two circuit nodes until voltage across the device exceeds a certain level, which then induces a permanent/irreversible low resistance/conductive path. FIG. 2A is a circuit schematic of OTP antifuse bit cell 201. During a programming operation, a program voltage is applied to a first terminal (e.g., anode) of antifuse 203. A second terminal (e.g., cathode) of antifuse 203 is coupled to ground, for example through a MOS pull-down access transistor 202. Hence, upon application of a control voltage to a gate of access transistor 202, the program voltage is dropped across terminals of antifuse 203, inducing dielectric breakdown in response to a high electric field.

As illustrated in the circuit schematic of FIG. 2A, an antifuse often employs a metal-insulator-metal (MIM) capacitor stack including a conductive material at both anode and cathode terminals separated by an insulator. Programming of antifuse 203 is through dielectric breakdown of the insulator by a voltage applied between the antifuse terminals. The dielectric breakdown induces an electrical short through the insulator. Conventional antifuse designs often employ a MOS transistor-based structure, as depicted in FIG. 2B. MOS antifuse 205 includes a transistor gate terminal 230 and source/drain contacts 241, 242. The antifuse circuit path passes through a gate dielectric 220, a doped semiconductor 208, and impurity doped semiconductor source/drain material 210. Formation of the illustrated conductive path during a programming operation entails permanently/irreversibly breaking down gate dielectric 220, reducing the electrical resistance between gate terminal 230 and source/drain contacts 241, 242.

One disadvantage of bit-cells 101 (FIG. 1A) and 201 (FIG. 2A) is the IC die area each requires. A significant portion of the required die area is attributable to access transistors 102 or 202. This disadvantage is magnified as MOS transistor feature dimensions decrease and/or the occupied percentage of an IC device increases. For example, to handle an OTP element programming current in the range of 1.5-3V, access transistor 102 may be significantly larger than a MOS transistor typically found within a logic circuit. Another disadvantage is reliability of the access transistor 102. Specifically, during OTP element programming, a source-drain short can form in access transistor 102, resulting in IC device yield loss. Hence, an OTP fuse or antifuse bit-cell design may require a high-voltage MOS transistor for the programming operation. The addition of such high-voltage MOS transistors along with low-voltage MOS transistors generally increases design and manufacturing complexity of an IC device.

Accordingly, an OTP bit-cell architecture of reduced size, reduced complexity, and/or greater reliability, would be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

Although the figures may illustrate embodiments where structures are substantially aligned to Cartesian axes (e.g., device structures having substantially vertical sidewalls), positive and negative (re-entrant) sloped feature sidewalls often occur in practice. For example, manufacturing non-idealities may cause one or more structural features to have sloped sidewalls. Thus, attributes illustrated are idealized merely for the sake of clearly describing salient features. In the figures.

DETAILED DESCRIPTION OF EXEMPLARY EMBODIMENTS

Figures 1A, 1B, 2A, 2B:
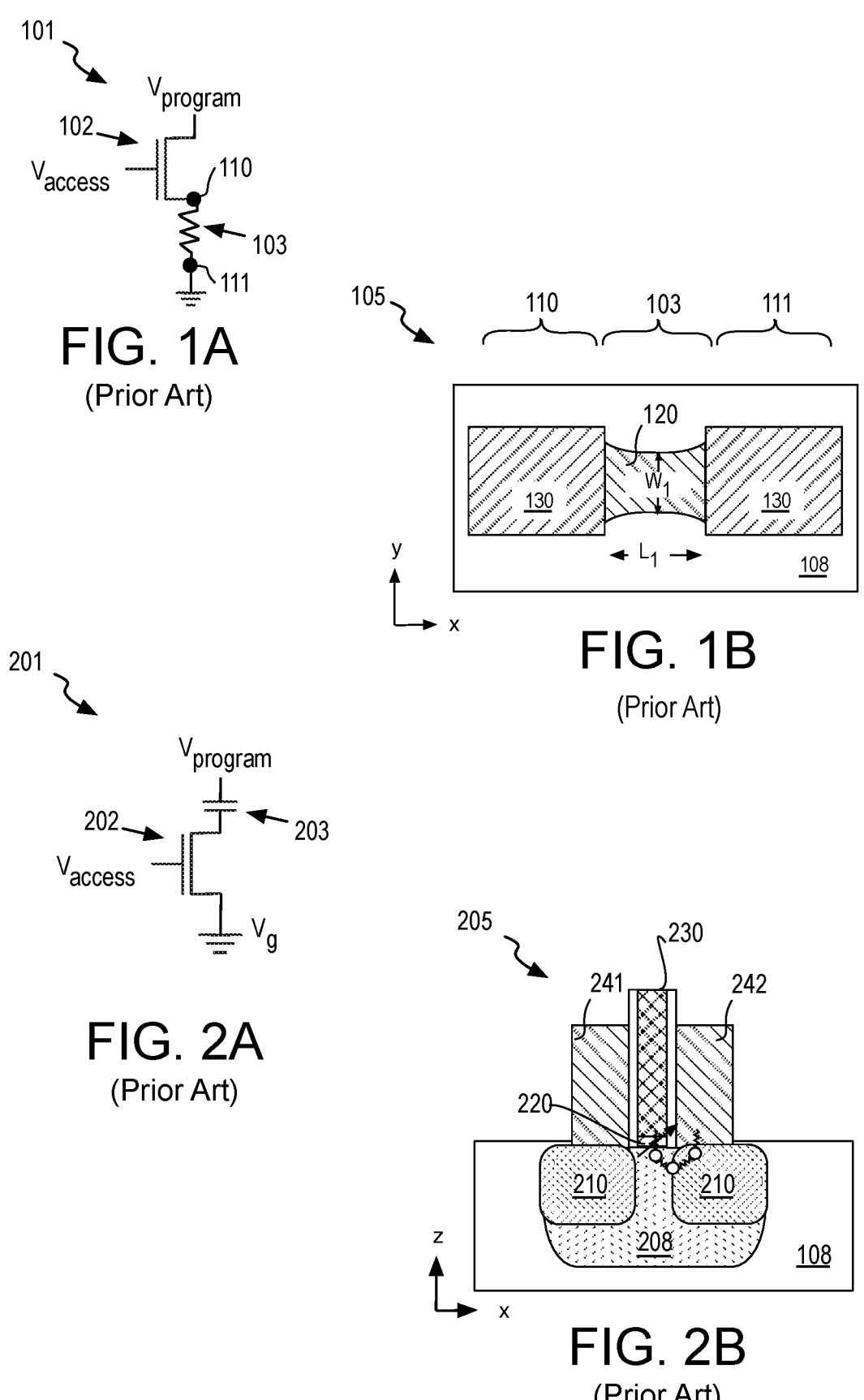
FIG. 1A is a fuse bit cell circuit schematic, in accordance with convention.
FIG. 1B is a plan view of an interconnect line fuse, in accordance with convention.
FIG. 2A is an antifuse bit cell circuit schematic, in accordance with convention.
FIG. 2B is a cross-sectional view of a metal-oxide-semiconductor (MOS) fuse, in accordance with convention.

Embodiments are described with reference to the enclosed figures. While specific configurations and arrangements are depicted and discussed in detail, this is for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, OTPical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Integrated circuit interconnect structures including one or more one-time programmable (OTP) bit-cells are described below. Each OTP bit-cell further includes an OTP element, such as a fuse or antifuse, coupled in electrical series with a selector that comprises a Schottky junction. The selector may be operable as transient voltage suppression (TVS) device that experiences electrical breakdown at a voltage below a programming voltage of the OTP element. In some exemplary embodiments, the TVS device comprises a metal-semiconductor-metal (MSM) material stack. In response to a programming voltage, a TVS-MSM stack may breakdown and pass a transient current sufficient for programming the OTP element. In response to a lower (e.g., read) voltage, the TVS-MSM stack may breakdown and pass a transient current insufficient for programming, but sufficient to sense a state of the OTP element. In response to an even lower (e.g., half-read) voltage, the TVS-MSM stack may present a high OTP bit-cell input impedance, reducing leakage and/or sneak path currents within an array of such bit-cells.

As further described below, OTP bit-cells including selectors in accordance with embodiments herein may be fabricated entirely within backend metallization levels of an IC. For example, both a fuse and a MSM material stack coupled in series with the fuse may each comprise one or more backend interconnect metallization features. While the fuse is to irreversibly transition from an electrically conductive state where a significant current can pass to an electrical open state, the MSM stack is to reversibly transition between a high impedance state to a state of breakdown where a large transient current is passed. As further described below, the MSM stack may be fabricated within an interconnect via, for example by providing a semiconductor material layer at a bottom of the via. Interconnect metallization features above and below the semiconductor material layer may be in direct contact with the semiconductor material layer, thereby providing a bidirectional diode comprising two back-to-back metal-semiconductor (i.e., Schottky) junctions.

In contrast to a conventional bit-cell access transistor comprising three terminals, the two-terminal selector structures described herein may offer higher bit-cell reliability. Whereas an access transistor includes a source and drain comprising semiconductor material, which may suffer damage under high voltage bias conditions, the diodic selector structures described herein comprise metal-semiconductor junctions that can pass very high transient currents (e.g., through a thermionic mechanism) without suffering catastrophic failure. Compared to bit-cell including an access transistor, the two-terminal selector structures described below may also enable a smaller bit-cell area or "height." Furthermore, because the selector does not rely on a gated MOS structure, an OTP array may be embedded within any IC without any impact to the design of a frontend device layer.

As described further below, a high fuse density is possible by locating the selector within an interconnect via structure. Notably, the via selector structures described herein may be based process modules readily integrated into back-end-of-line (BEOL) IC device interconnect fabrication. For example, an existing MIM capacitor fabrication process may be modified to integrate a semiconductor material layer into a via structure, in accordance with embodiments herein. The thickness and/or compositions of the MSM material layers may be selected for a desired Schottky barrier height and breakdown voltage response.

Figures 3A, 3B:
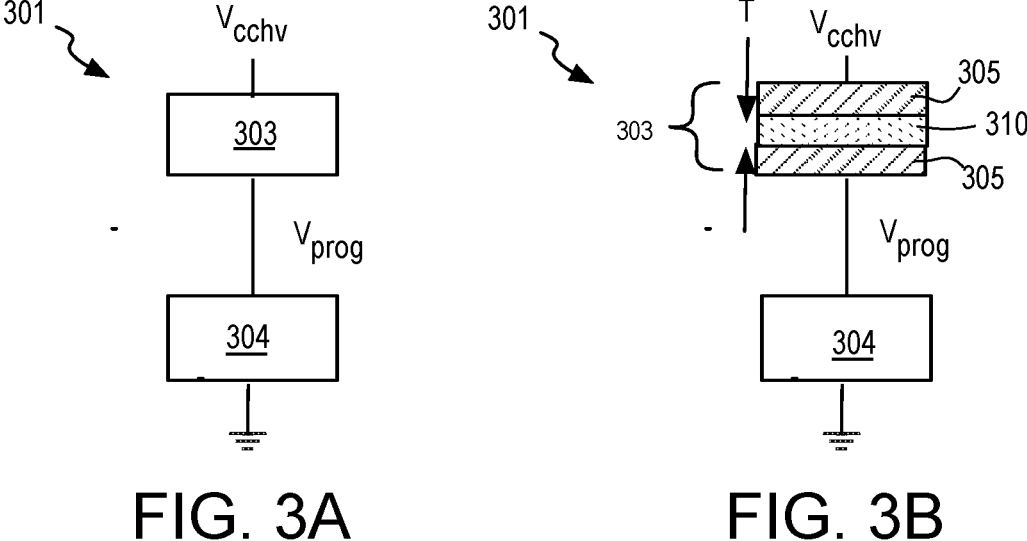
FIG. 3A is a schematic of an OTP bit-cell including a selector comprising a Schottky junction, in accordance with some embodiments.
FIG. 3B is a schematic of an OTP bit-cell including a selector comprising a metal-semiconductor-metal (MSM) material stack, in accordance with some embodiments.

FIG. 3A is a schematic of an OTP bit-cell 301, which includes a selector 303 in electrical series with an OTP element 304. A first terminal of selector 303 is coupled to a circuit node that is to be biased to a predetermined high-voltage supply, $V_{cchv}$. A second terminal of selector 303 is coupled to a first terminal of OTP element 304 and a second terminal of OTP element 304 is couple to a circuit node that is to be at some reference voltage (e.g., ground). With selector 303 and OTP element 304 in series between the $V_{cchv}$ circuit node and the reference voltage circuit node, selector 303 drops a portion of the high-voltage, for example an amount dependent on a metal-semiconductor barrier height of a Schottky junction. High-voltage supply, $V_{cchv}$ may be predetermined so that a program voltage $V_{prog}$ (or program current) of sufficient magnitude is dropped across the terminals of OTP element 304.

In some embodiments, selector 303 comprises at least one diode that is to be reversed biased by a voltage applied to program and/or read OTP element 304. While the diode may be a p/n junction diode, in some exemplary embodiments selector 303 comprises at least one Schottky junction. In contrast to a p/n junction diode that relies on minority carrier injection, the dominant current transport in a diodic Schottky junction is thermionic emission.

Although selector 303 may be unidirectionally diodic, in some exemplary embodiments selector 303 bidirectionally diodic. Bidirectional diodic behaviour may be advantageous for electrical isolation of an OTP bit-cell within an array, for example where a set and reset voltage of opposite polarity is employed by one or more of a wordline driver or data column sense amp, etc. In some exemplary bidirectional embodiments, selector 303 is operable as a transient voltage suppression (TVS) diode. Properties of the TVS diode may be controlled so that selector 303 experiences electrical breakdown when biased by a voltage somewhat less than OTP element programming voltage $V_{prog}$. Upon entering breakdown, selector 303 is to pass a transient current sufficient to program OTP element 304. However, when biased by a voltage insufficient to induce electrical breakdown within the TVS diode, selector 303 provides a high input impedance for bit-cell 301.

In contrast to a TVS diode that might be coupled in parallel to protect a vulnerable circuit element from voltage spikes by shunting a transient current past the vulnerable circuit element, a TVS diode selector in accordance with embodiments herein is to discharge the transient current through OTP element 304 as the vulnerable circuit element that is to undergo an irreversible state change. For exemplary embodiments both a read voltage and a program voltage are sufficient to breakdown the TVS diode. Any voltages bit-cell 301 may be subjected to that are significantly below a read voltage threshold are advantageously insufficient to breakdown the TVS diode.

While a TVS diode may be implemented with various multi-diode topologies, including a network of multiple p/n junction diodes, in accordance with some TVS diode embodiments, selector 303 comprises two, back-to-back Schottky junctions. Two back-to-back Schottky junctions display bidirectional diodic behavior and may be implemented in a space efficient manner with a metal-semiconductor-metal (MSM) material stack.

An MSM material stack is therefore one exemplary implementation of back-to-back Schottky junctions that is to be operable as a TVS diode suitable as an OTP bit-cell selector. Material properties of a MSM material stack may be controlled to ensure selector 303 is operable as a TVS diode with a suitable working voltage and transient current response. FIG. 3B illustrates a schematic of one embodiment of OTP bit-cell 301 where selector 303 comprises a metal-semiconductor-metal material stack with a semiconductor material layer 310 between two metal electrode material layers 305.

In FIG. 3B, each metal electrode material layer 305 may be any electrically conductive material that is compatible with semiconductor material layer 310. In some embodiments, each metal electrode material layer 305 is of a composition suitable for IC interconnects, capacitors, or other device contacts. In some embodiments, each metal electrode material layer 305 has substantially the same composition. In other embodiments, for example where asymmetrical bidirectional diodic behavior is desired, one metal electrode material layer 305 has a first composition while another metal electrode material layer 305 has a second, different, composition.

In some exemplary embodiments, at least one metal electrode material layer 305 comprises a metal, such as, but not limited to, copper, tungsten, nickel, cobalt, aluminum, molybdenum, ruthenium, platinum, or titanium. Each metal electrode material layer 305 may be substantially one metal with only trace impurities. Alternatively, each metal electrode material layer 305 may include a significant portion of dopants. Metal electrode material layer 305 may also comprise plurality of metals layered in a stack structure, or compositionally graded. Each metal electrode material layer may also be a homogenous alloy of multiple constituent metals, or comprise a grading of alloyed metals, etc. In some embodiments, at least one metal electrode material layer 305 is a metallic compound, such as one or more of metal-nitrides, metal-carbides, or metal-silicides. As one specific example, at least one metal electrode material layer 305 is TiN (i.e., predominantly titanium and nitrogen). In another specific example, at least one metal electrode material layer 305 is predominantly Ni.

Selector 303 includes an MSM stack comprising semiconductor material layer 310 between the metal electrode material layers 305. In the exemplary embodiment illustrated, semiconductor material layer 310 is in direct contact with each metal electrode material layer 305 so that the one semiconductor material layer 310 provides two metal-semiconductor junctions separated by a thickness T of the semiconductor material layer. The chemical composition of semiconductor material layer 310 may vary with implementation and may depend upon at least the composition of metal electrode material layer 305 to provide suitable Schottky junction barrier height(s).

In some exemplary embodiments, semiconductor material layer 310 comprises a Group IV semiconductor material, for example comprising at least one of Si or Ge. In some embodiments, semiconductor material layer 310 is substantially pure Si. In other embodiments, semiconductor material layer 310 is substantially pure Ge. The smaller work function of Ge, and ability to deposit Ge at lower temperatures may offer some advantages over substantially pure Si. In still other embodiments, semiconductor material layer 310 may be any $Si_xGe_{1-x}$ alloy offer a range of tunable band gaps and/or metal-semiconductor barrier heights.

In other embodiments, semiconductor material layer 310 is a metal oxide semiconductor comprising predominantly one or more metals and oxygen. Examples include metal oxides with a transition metal (e.g., IUPAC group 4-10) or post-transition metal (e.g., IUPAC groups 11-15). In some embodiments, semiconductor material layer 310 includes at least one of Mg, Cu, Zn, Sn, Ti, Ni, Ga, In, Sb, Sr, Cr, Co, V, or Mo. Semiconductor material layer 310 may comprise a suboxide ($A_2O$), monoxide (AO), binary oxide ($AO_2$), ternary oxide ($ABO_3$), or mixture thereof.

Semiconductor material layer 310 may, for example, comprise a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is too low, and a pure insulator if x is too high). In some other embodiments, semiconductor material layer 310 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, semiconductor material layer 310 comprises titanium oxide ($TiO_x$), or $SnO_x$. Exemplary oxide semiconductors that may have suitable p-type conductivity include copper oxide ($CuO_x$) In some $CuO_x$ embodiments, semiconductor material layer 310 is Cu(I) oxide, or $Cu_2O$. In other embodiments, semiconductor material layer 310 is Cu(II) oxide (CuO) or a mixture of CuO and $Cu_2O$, where x may range between 0.5 and 1. Still other exemplary oxide semiconductor compositions include $NiO_x$.

Semiconductor material layer 310 may be intrinsic or have either p- or n-conductivity type as a function of composition. Hence, semiconductor material layer 310 may also comprise one or more p-type (acceptor) dopants or n-type (donor) dopants. Semiconductor material layer 310, or various portions thereof, may therefore be intentionally doped, or not. Compared to intrinsic semiconductor material that is not intentionally doped, n-type and p-type semiconductor materials may have a higher concentration of impurities, such as, but not limited to, one or more group III elements, group V elements, and/or elemental hydrogen (H), and/or other sources of oxygen vacancies. In some embodiments where semiconductor material layer 310 comprises $ZnO_x$, dopants may include In and Ga. In some specific examples, semiconductor material layer 310 is $InGaO_3$ $(ZnO)_5$, often referred to simply as IGZO.

Regardless of chemical composition, semiconductor material layer 310 may have any microstructure. In some examples, semiconductor material layer 310 is substantially amorphous or polycrystalline. Semiconductor material layer 310 may have any thickness T for a suitable threshold voltage and/or other IV characteristic desired for selector 303. For some exemplary embodiments where semiconductor material layer 310 is predominantly silicon, semiconductor material layer thickness T is less than 20 nm (e.g., 5-15 nm).

Figures 3C, 3D:
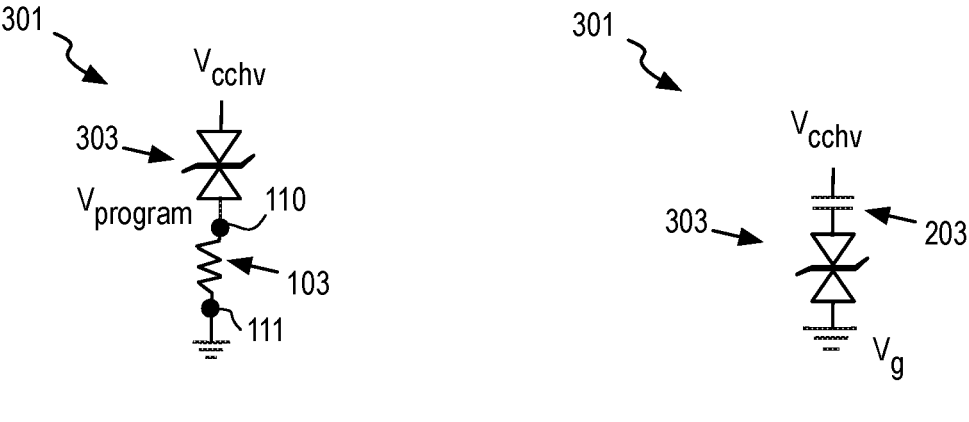
FIG. 3C is a schematic of an OTP bit-cell including a TVS selector in series with a fuse, in accordance with some embodiments.
FIG. 3D is a schematic of an OTP bit-cell including an TVS selector in series with an antifuse, in accordance with some embodiments.

Notably, bit-cell 301 may comprise any suitable OTP element 304. FIG. 3C is a schematic of an OTP bit-cell including selector 303, represented in the circuit as a TVS diode, in series with a fuse resistor 103, in accordance with some embodiments. Fuse resistor 103 may be substantially as described elsewhere herein, or a fuse resistor 103 may comprise a MIM stack, for example substantially as described in commonly-assigned U.S. application Ser. No. 17/835,863, titled "Interconnect Via Metal-Insulator-Metal (MIM) Fuse for Integrated Circuitry," file on Jun. 8, 2022 and incorporated herein by reference in its entirety for all purposes.

As illustrated in FIG. 3C, one terminal of selector 303 is connected to a circuit node controlled to supply voltage $V_{cchv}$ while a second terminal of selector 303 is connected to fuse electrode 110. The second fuse electrode 111 is connected to a circuit node controlled to one or more reference voltages. Operable as a TVS diode during program, selector 303 is to pass a transient current sufficient to induce an electrical open within resistor 103. Also operable as a TVS diode during a lower read voltage, selector 303 is again to pass a transient current, but one that is insufficient to induce an electrical open within resistor 103. Instead, resistor 103 is to sustain the lesser transient current, providing a basis for sensing a resistance of resistor 103.

FIG. 3D is a schematic of an OTP bit-cell 301 including selector 303, again represented as a TVS diode, in series with antifuse 203, in accordance with some alternative bit-cell embodiments. Antifuse 203 may be substantially as described elsewhere herein, for example. In the embodiments illustrated in FIG. 3D, one terminal of antifuse 203 is connected to a circuit node controlled to supply voltage $V_{cchv}$ while a second terminal of antifuse 203 is connected to a first terminal of selector 303. A second selector terminal is connected to a circuit node controlled to one or more reference voltages. Operating as a TVS diode during program, selector 303 is to pass a transient current sufficient to induce an electrical short within antifuse 203. Also operating as a TVS diode during a lower read voltage, selector 303 is again to pass a transient current, but one that is insufficient to induce a sufficient voltage across antifuse 203 to form an electrical short within antifuse 203. Instead, antifuse 203 is to survive the transient, providing a basis for sensing a resistance of antifuse 203.

Although FIGS. 3C and 3D illustrate two exemplary variations, selector 303 may be configured in series according to either the arrangement illustrated in FIG. 3C or the arrangement illustrated in FIG. 3D for any OTP element (e.g., fuse or antifuse).

Figure 3E:
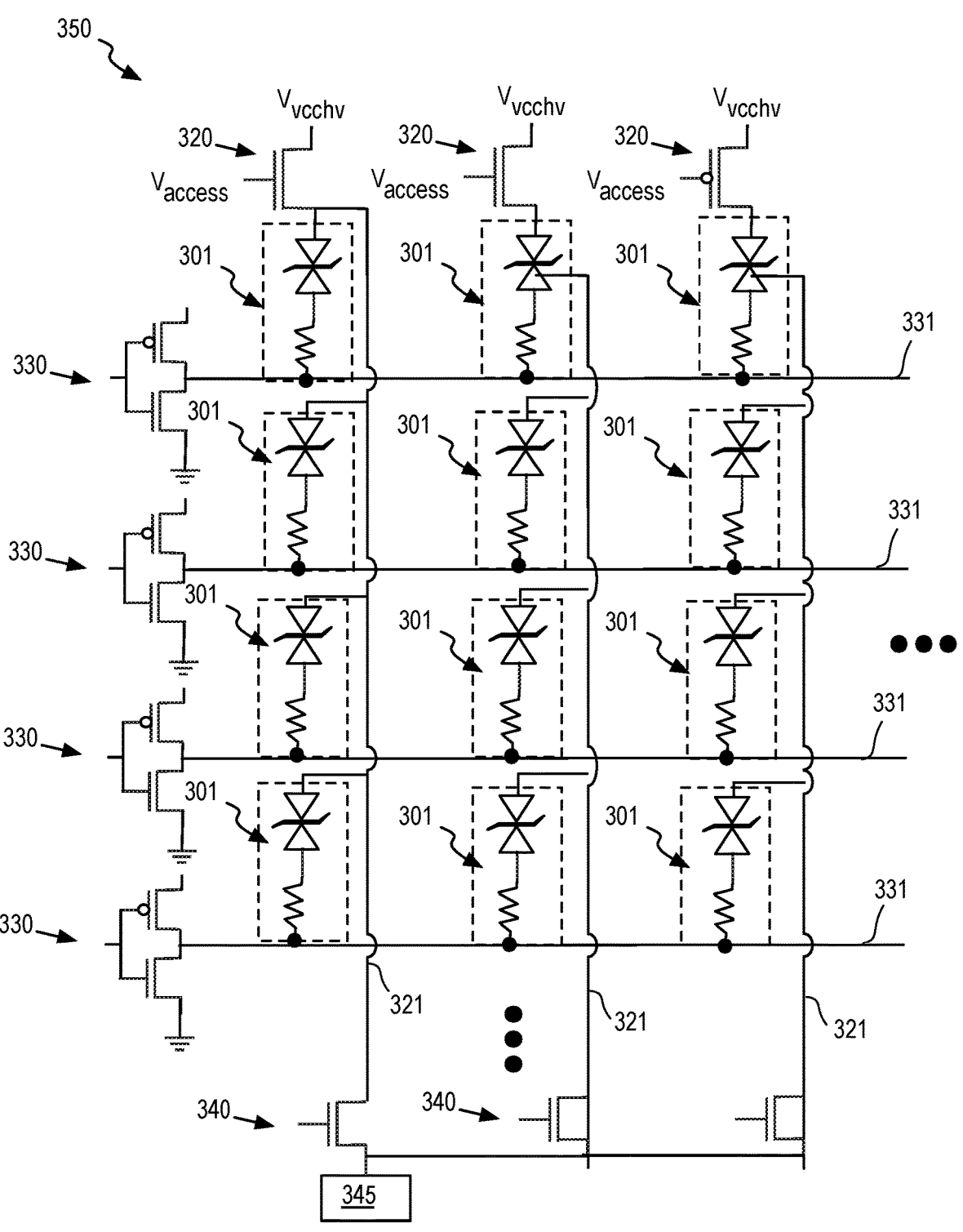
FIG. 3E is a schematic of an OTP memory array comprising a plurality of OTP bit-cells including TVS-MSM selectors, in accordance with embodiments.

FIG. 3E is a schematic of an OTP memory array 350 comprising a plurality of OTP bit-cells 301, in accordance with some embodiments. OTP memory array 350 may be integrated into any known IC. Although each bit-cell 301 of memory array 350 has the architecture shown in FIG. 3C, each bit-cell 301 may instead have the architecture shown in FIG. 3D. Each bit-cell 301 may also include one of the alternative selector architectures described above, such as a unidirectional diode, etc.

The memory array 350 may have any number of data columns output to a sense amplifier 345, which may, for example, perform a comparison of a data column to a reference column for differential sensing. Each bit-cell 301 has a fuse element with a first terminal coupled to a first terminal of a TVS diode (e.g., comprising a MSM material stack) selector in series between a bitline 321 and a wordline 331. A second terminal of the fuse element is coupled to a wordline 331. One wordline 331 may concurrently drive multiple bit-cells 301 for a program or read. Each wordline 331 is coupled to a wordline driver 330 with a supply voltage that can be switched, for example between program and read states. Each bitline 321 is similarly coupled to a supply voltage $V_{cchv}$ through a pass gate 320 for programming and a pass gate 340 for reading. While column pass gates 320, 340 and row driver 330 may each comprise a MOS transistor (PMOS and/or NMOS implemented within a frontend device layer of an IC), each bit-cell 301 may be advantageously implemented exclusively within backend interconnect levels of an IC. For example, both an MSM material stack and a fuse or antifuse may consist of materials and/or structures with backend interconnect levels of an IC.

To program a cell, a wordline driver 330 and a bitline pass gate 320 may be set to an on state and a high voltage supply sufficient for the Schottky diode selector to enter electrical breakdown is supplied to the selected bit-cell 301. Operating as a TVS diode, a transient current sufficient to induce an electrical open with in the series-connected fuse element is passed. Fuse elements of all other bit-cells may remain electrically isolated by the high selector impedance when not driven into electrical breakdown.

To read a bit-cell, a data column may be selected by pass gate 340 along with setting a suitable voltage to a particular wordline 331. A reference cell coupled to a reference dataline (not depicted) for sense amplifier 345 can also be selected to compare the resistance difference while all other data columns are disabled. Fuse elements of all other bit-cells may remain electrically isolated by the high selector impedance when not in electrical breakdown.

Figure 4A:
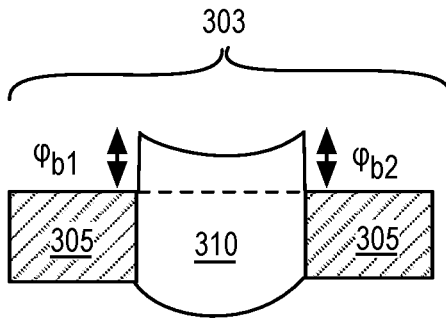
FIG. 4A is a band diagram illustrating an MSM selector under zero voltage bias, in accordance with some embodiments.
Figure 4B:
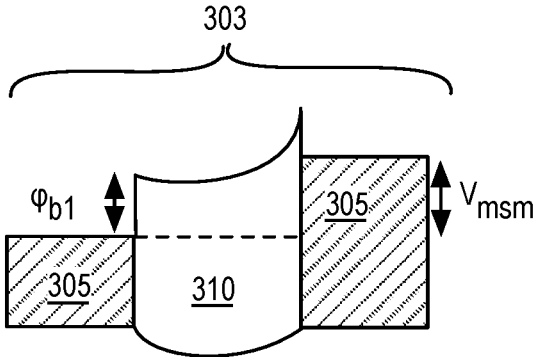
FIG. 4B is a band diagram illustrating the MSM selector illustrated in FIG. 4A under forward voltage bias, in accordance with some embodiments.
Figure 4C:
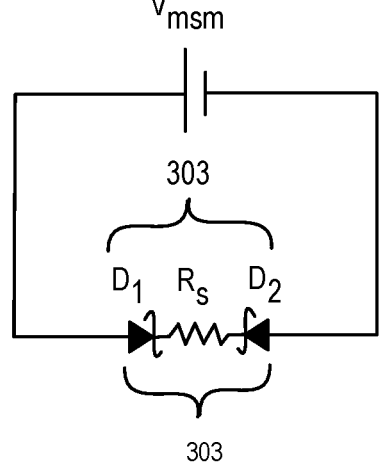
FIG. 4C is an equivalent circuit diagram for the MSM selector illustrated in FIG. 4B, in accordance with some embodiments.

FIG. 4A is a band diagram illustrating an MSM selector 303 under zero voltage bias. As shown, each metal-semiconductor interfaces is associated with a metal-semiconductor barrier height φ dependent on the metal-semiconductor workfunction difference. FIG. 4B is a band diagram illustrating the MSM selector illustrated in FIG. 4A under forward voltage bias, in accordance with some embodiments. FIG. 4C is an equivalent circuit diagram for the forward biased MSM selector illustrated in FIG. 4B, in accordance with some embodiments. Series resistance is labeled as RS, $\varphi_{b1}$ and $\varphi_{b2}$ represents Schottky barrier height at diode D1 and diode D2, respectively.

The Schottky barrier height between electrode metal layers 305 and semiconductor material layer 310 is a function of their chemical composition and interface density of states. Some electrode materials, such as Ti, may tend to be pinned at midgap of hydrogenated amorphous silicon, for example. Other electrode materials may tend to be pinned closer to the valence band of silicon (e.g., Ni), while still others may tend to be pinned closer to the conduction band. Accordingly, $\varphi_{b1}$ and $\varphi_{b2}$ may vary with implementation. In some examples where semiconductor material layer 310 is amorphous silicon having a bandgap of around 1.6-1.8 eV, an exemplary range of $\varphi_{b1}$ and $\varphi_{b2}$ is 0.5 eV-0.9 eV. Current density for a MSM TVS of a particular dimension is also dependent on properties of the materials in the stack. A reference OTP element design, for example requiring a particular programming voltage (e.g., 2-3V) and/or programming current may be enlisted to arrive at a MSM material stack of suitable composition and dimensions to provide an adequate transient current supply.

Figure 5:
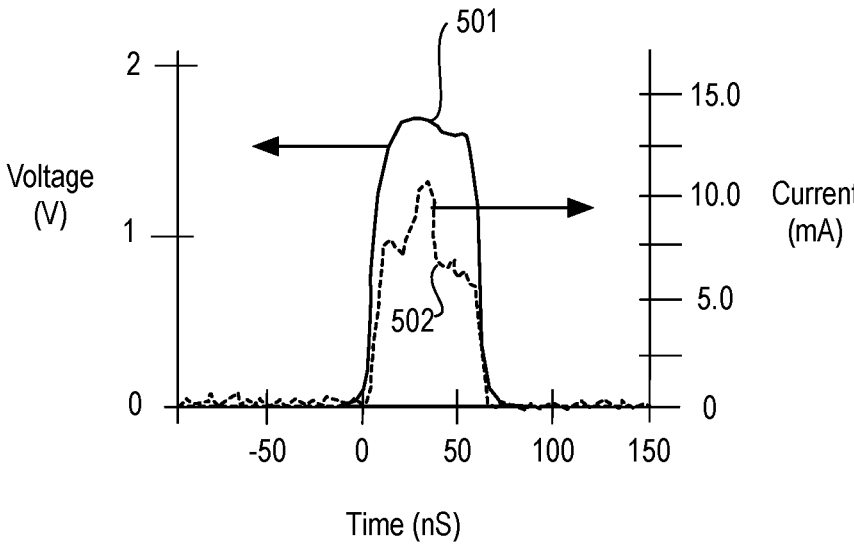
FIG. 5 is an I-V graph illustrating transient current through a TVS-MSM selector in response to an applied voltage, in accordance with some embodiments.

FIG. 5 is an I-V graph illustrating transient current through a TVS selector in response to an applied voltage, in accordance with some MSM selector embodiments. In FIG. 5, time is plotted to the x-axis. The magnitude of a voltage applied across a TVS-MSM selector is plotted to the primary y-axis. A response current of the TVS-MSM selector is plotted to the secondary y-axis. In this example, an input pulse 501 generated by a voltage source spans approximately 60 ns and peaks slightly above 1.5V. The TVS-MSM response 502 peaks at a current of around 10 mA, which is an overshoot that is only ~25% higher than the mean current during input pulse 501. Notably, there is little delay or distortion in response 502, which is advantageous as OTP elements typically have a speed requirement.

Figure 6:
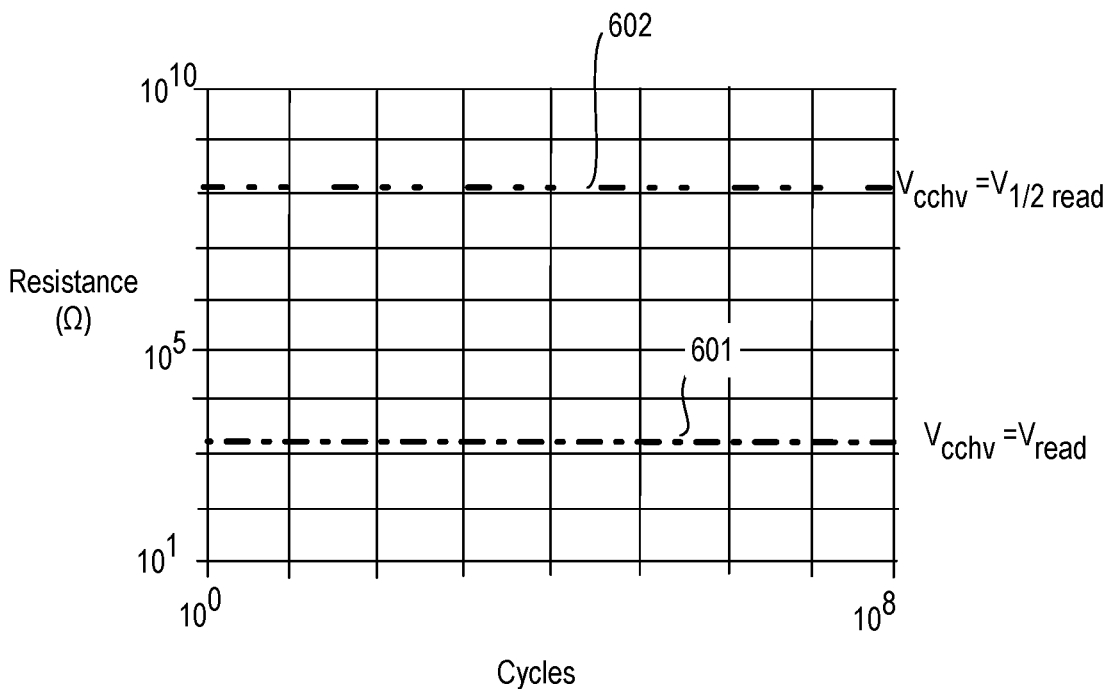
FIG. 6 is a graph illustrating electrical resistance of a TVS-MSM selector in response to applied voltages above and below a breakdown voltage of the selector, in accordance with some embodiments.

FIG. 6 is a graph illustrating electrical resistance for an TVS-MSM selector in response to applied voltages above and below a breakdown voltage of the selector, in accordance with some embodiments. Data is FIG. 6 was collected after the selector was pulsed to record resistance of the device over cycles of electrical breakdown. In FIG. 6, response 601 is the electrical resistance of a TVS-MSM selector when subjected to a read voltage, which is also sufficient to induce a transient current associated with electrical breakdown. Response 602 is the electrical resistance of a TVS-MSM selector when subjected to ½ the read voltage, which is insufficient to induce a transient current associated with electrical breakdown. As shown, the resistance (NL) ratio of the selector is more than $5 \times 10^5$ after $10^8$ cycles without any significant degradation.

Figure 7:
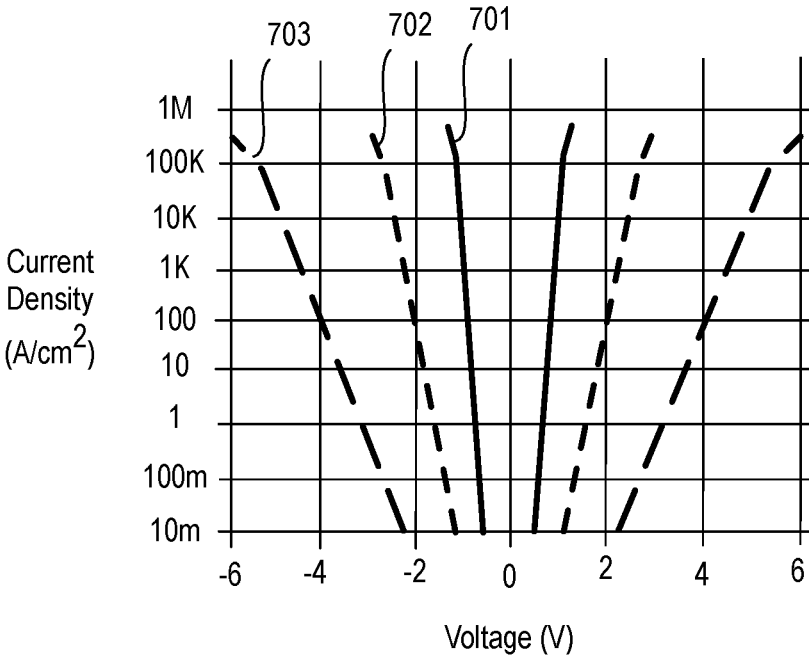
FIG. 7 is a graph illustrating IV curves of MSM selectors having semiconductor materials of different thickness, in accordance with some embodiments.

FIG. 7 is a graph illustrating IV curves of TVS-MSM selectors having semiconductor materials of different thickness, in accordance with some embodiments. In FIG. 7, current density is plotted to the y-axis for an applied voltage plotted to the x-axis. Reponses 701, 702 and 703 illustrate low, medium and high thicknesses of the semiconductor material layer, respectively. Electrode metal layers are the same for the illustrated treatments. As shown, threshold voltage and series resistance increases with thickness.

Figure 8:
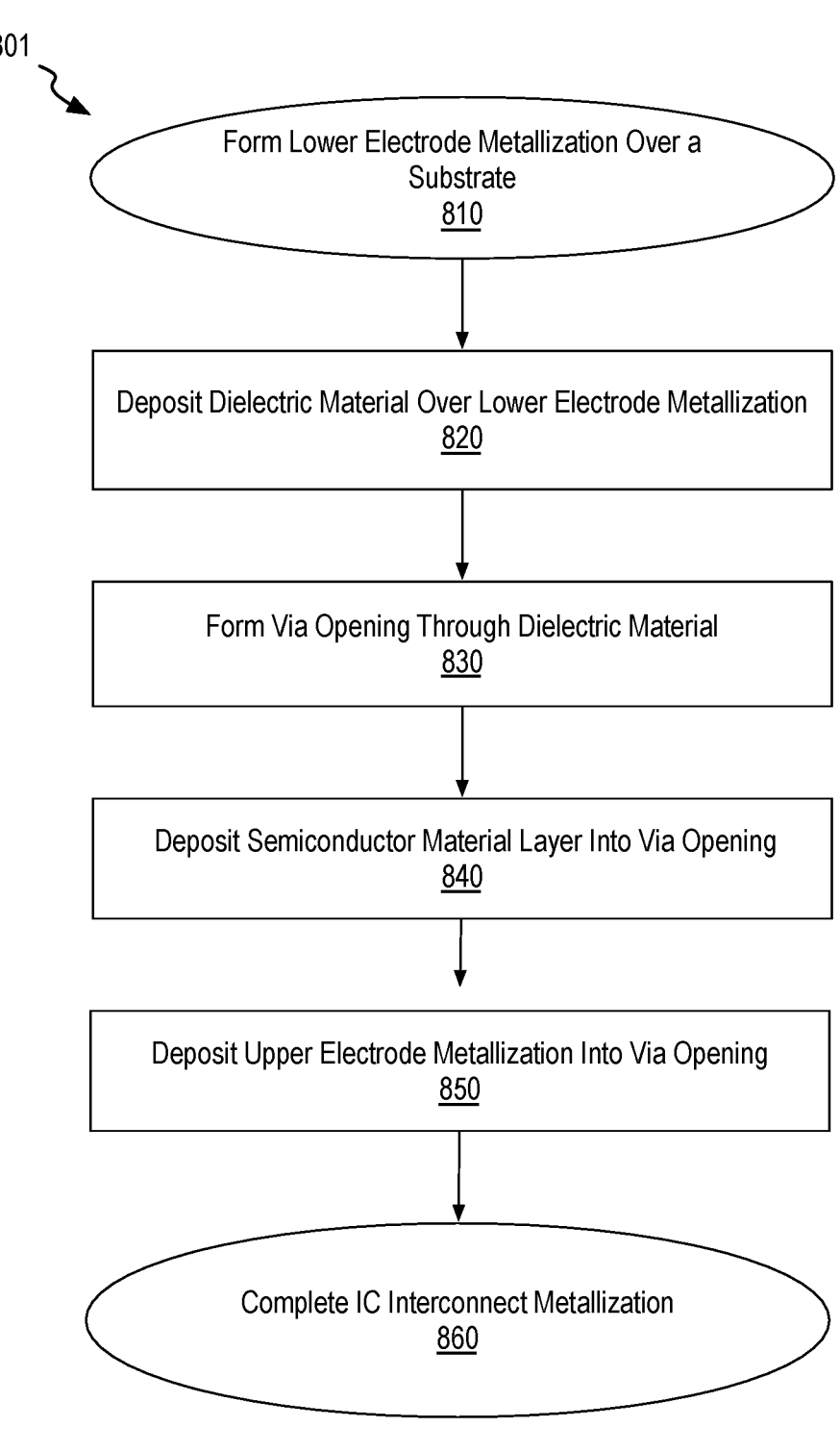
FIG. 8 is a flow diagram illustrating methods of fabricating an MSM selector within interconnect metallization levels of an IC die, in accordance with some embodiments.

A selector with one or more Schottky junction, as well as any IC incorporating such a selector, may be fabricated according to a wide variety of techniques. FIG. 8 is a flow diagram illustrating some exemplary methods 801 for fabricating a TVS-MSM within interconnect metallization levels of an IC die. FIG. 9A-9D are cross-sectional views of an IC structure portion 901 evolving as the methods 801 are practiced in accordance with some embodiments. IC structures other than IC structure portion 901 may be fabricated according to methods 801. Similarly, IC structure portion 901 may be fabricated according to a method distinct from methods 801.

Referring first to FIG. 8, methods 801 begin at input 810 where a lower selector electrode metallization is formed over an IC substrate. The IC substrate may include any base material known to be suitable for IC fabrication, such as a large format (e.g., 300-450 mm) wafer. One or more lithographic patterning processes may be performed at input 810. For example, a single or a double patterning process may be practiced to define electrode metallization of any suitable chemical composition and having any suitable lateral and vertical dimensions. In some embodiments, one or more damascene-type line or via formation processes comprising metal planarization are performed at input 810 based on the lithographic patterning process(es). In alternative embodiments, one or more subtractive line or via patterning process(es) are performed at input 810 based on the lithographic patterning process(es).

Figure 9A:
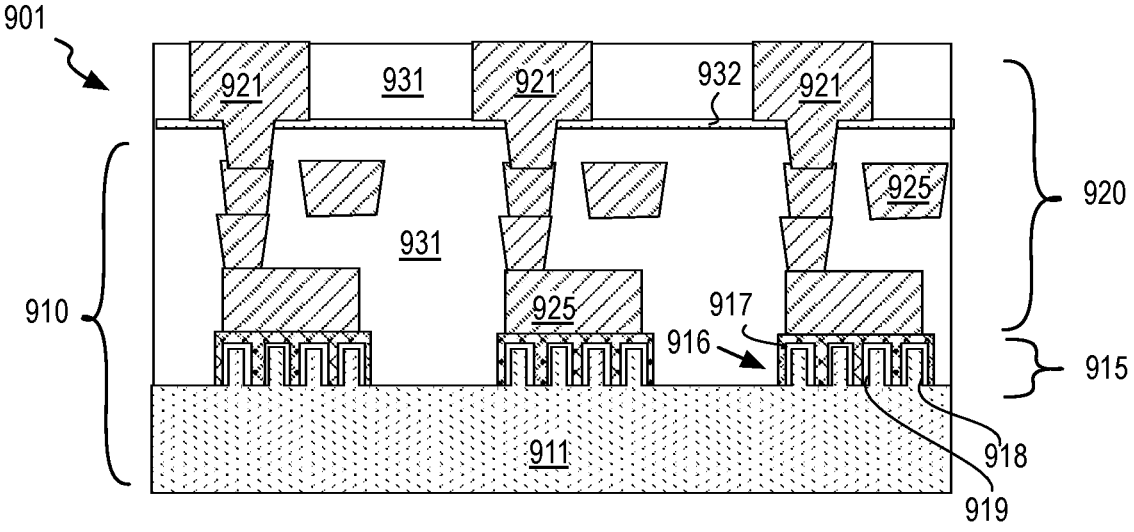
FIGS. 9A, 9B, 9C and 9D are cross-sectional views of an IC structure evolving as the methods illustrated in FIG. 8 are practiced in accordance with some embodiments.

FIG. 9A further illustrates an exemplary IC structure portion 901 including first electrode metallization 921 over an IC substrate 910 comprising a base material 911. In some examples, base material 911 is substantially (mono)crystalline. Base material 911 may, for example, include one or more Group IV semiconductor material layers (e.g., Si, Ge, SiGe, GeSn, etc.), one or more Group III-V semiconductor material layers (e.g., InGaAs), one or more Group III-N semiconductor material layers (e.g., GaN), a combination of such semiconductor material layers, or other material (e.g., sapphire) known to be suitable as a workpiece substrate for IC device fabrication.

IC substrate 910 includes at least one device layer 915, each including one or more semiconductor materials. In the illustrated example, device layer 915 comprises non-planar field effect transistors (FETs) 916. FETs 916 may be finFETs, nanoribbon or nanosheet FETs, nanowire FETs, stacked ribbon or wire FETs, etc. In the plane of FIG. 9A, a gate electrode 917 and a channel semiconductor 918 separated by a gate insulator 919 are visible. Out of the plan of FIG. 9A, a source and drain (not depicted) are coupled to opposite ends of channel semiconductor 918. Channel semiconductor 918 may comprise any suitable monocrystalline semiconductor material (e.g., silicon, Ge, SiGe, GeSn, etc.). Such FETs may be part of any application specific IC (ASIC) including one or more IP cores, for example.

IC substrate 910 further includes interconnect levels 920 comprising metallization features 925 that electrically interconnect devices (e.g., FETs 916, DRAM memory cells, RRAM memory cells, MRAM memory cells, etc.) of one or more device layers including device layer 915. In some embodiments, circuitry within IC structure portion 901 comprises a microprocessor core, further including an arithmetic logic unit (ALU) and shift registers, for example. In other examples, circuitry within IC structure portion 901 comprises a wireless radio circuit or floating-point gate array (FPGA).

As illustrated, electrode metallization 921 is a subset of metallization features 925 and separate features of electrode metallization 921 are arrayed over an area of IC structure portion 901 within one of interconnect levels 920. Electrode metallization 921 may have the same composition as other metallization features 925 or may be of a distinct composition specific to a OTP cell selector structure. Accordingly, electrode metallization 921 may comprise one or more of any conductive materials known to be suitable for IC interconnects or capacitor electrodes. In some embodiments, each of electrode metallization 921 comprises a metal, such as any of those described above. In some embodiments, electrode metallization 921 is predominantly Ti or Ni. In other embodiments, electrode metallization 921 is predominantly Ru, Co, Mo, W, or Pt. Electrode metallization 921 may be patterned according to subtractive or damascene techniques, with the latter being more suitable for embodiments where the chemical composition of electrode metallization 921 is not amenable to definition through etching processes.

Interconnect levels 920 include one or more dielectric materials 931 and 932 surrounding metallization features 925. The chemical composition of dielectric materials 931 and 932 may be any known to be suitable as an IC device interlayer dielectric (ILD). In some embodiments, dielectric materials 931 and 932 comprise oxygen and may further comprise silicon (e.g., $SiO_2$, SiOC(H), SiON, etc.). Dielectric materials 931 and 932 may have any thickness (e.g., in z-dimension), as embodiments are not limited in this context.

Returning to FIG. 8, methods 801 continue at block 820 where a dielectric material is deposited over the first (lower) selector electrode metallization. The dielectric material may be any suitable as an interlayer dielectric (ILD) for IC interconnects and may be deposited to any thickness suitable for electrically isolated to adjacent levels of metallization. At block 830, a via opening is formed through the dielectric material, exposing a portion of the underlying electrode metallization. Any via patterning (e.g., lithography and etch) process(es) known to be suitable for forming interconnect vias through dielectric material of a particular composition may be practiced at block 830.

Figure 9B:
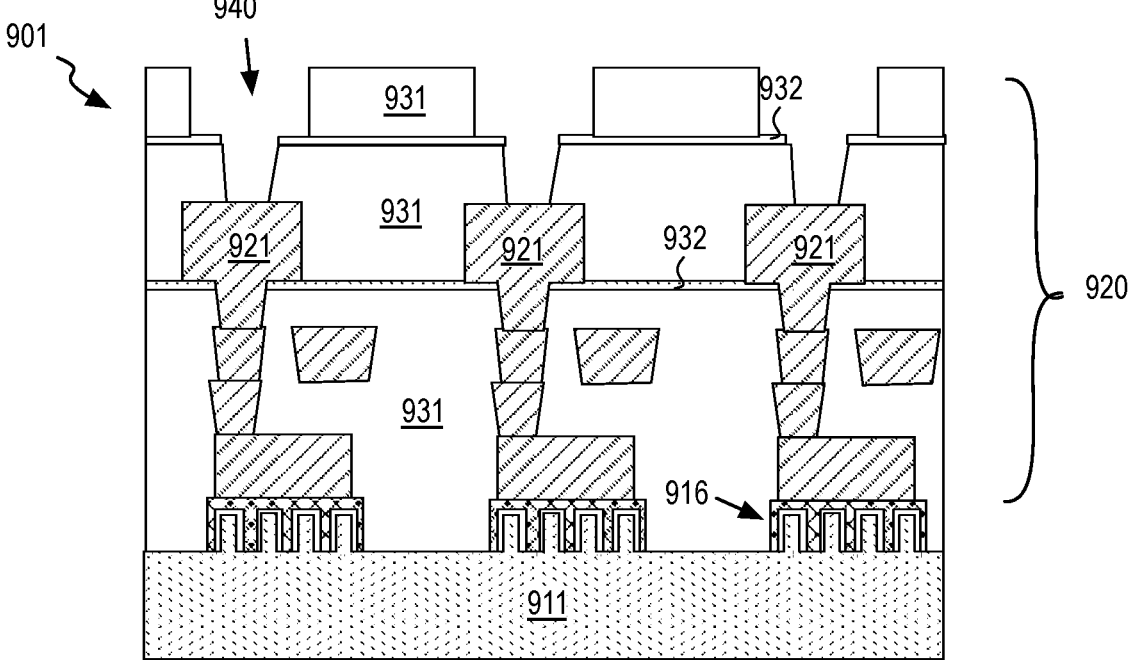
Figure 9C:
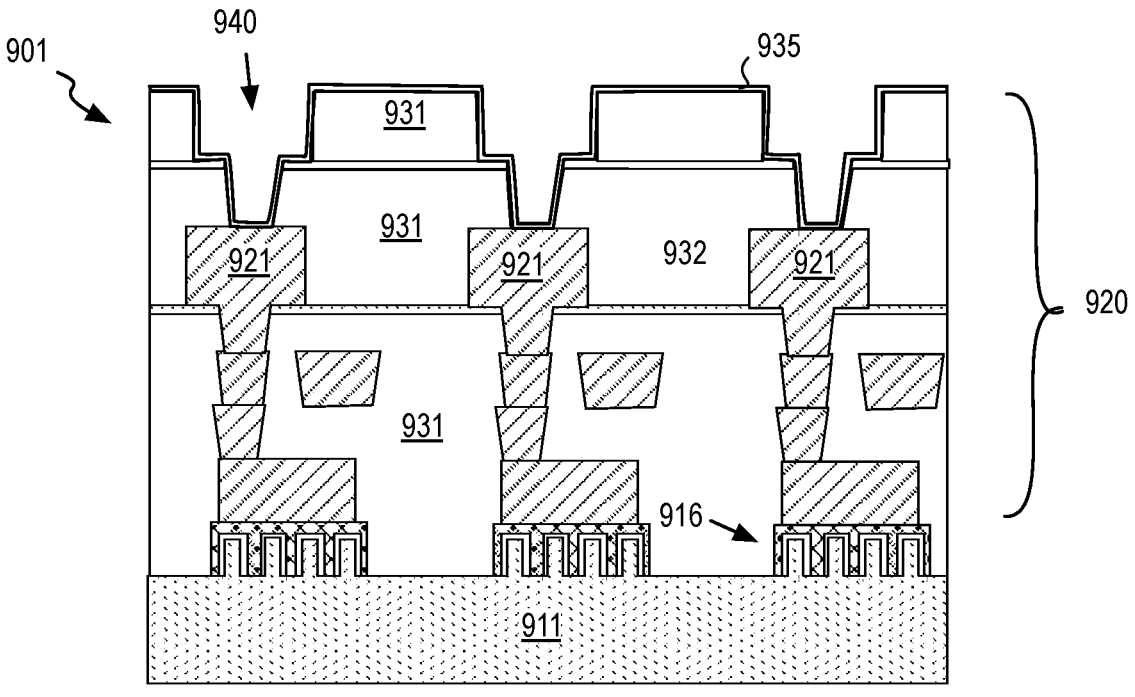

In the example further illustrated in FIG. 9B, additional dielectric materials 931, 932 have been deposited over electrode metallization 921. An array of via openings 940 have been etched through the thickness of dielectric material 931, each of the via openings 940 exposing a portion of a corresponding feature of electrode metallization 921. In this example, each of the via openings 940 are formed as part of a dual-damascene interconnect structure that further comprises a trench opening of larger area than the via opening.

Returning to FIG. 8, methods 801 continue at block 840 where a semiconductor material layer is deposited into the via opening. In exemplary embodiments, a highly conformal deposition process is employed to precisely control the semiconductor material layer thickness. In some embodiments, silicon and/or germanium is deposited with a chemical vapor deposition (CVD) process. In alternative embodiments, a metal oxide is deposited with an atomic layer deposition (ALD) process employing a metal precursor and an oxygen precursor. Any number of ALD cycles may be performed, for example to form a semiconductor material layer 935 further depicted in FIG. 9C. In this exemplary embodiment, semiconductor material layer 935 has a substantially conformal thickness (e.g., no more than 10 nm) and fully lines the dual-damascene structure.

Returning to FIG. 8, methods 801 continue at block 850 where another (upper) electrode metallization is deposited over the semiconductor material layer to form an MSM material stack within the via opening. Electrode metallization may be deposited by any technique(s) known to be suitable for IC interconnect metallization and/or diode metallization. In some embodiments, a sputter deposition process and/or an electrolytic or electroless plating process is practiced at block 850. One or more metal may also be deposited by ALD. In some examples, multiple deposition processes are practiced at block 850, for example sputter-deposition of an electrode layer may precede electrolytic plating of a fill metal. Methods 801 (FIG. 8) then end at output 860 where IC interconnect metallization is completed in any manner known to be suitable for IC device.

Figure 9D:
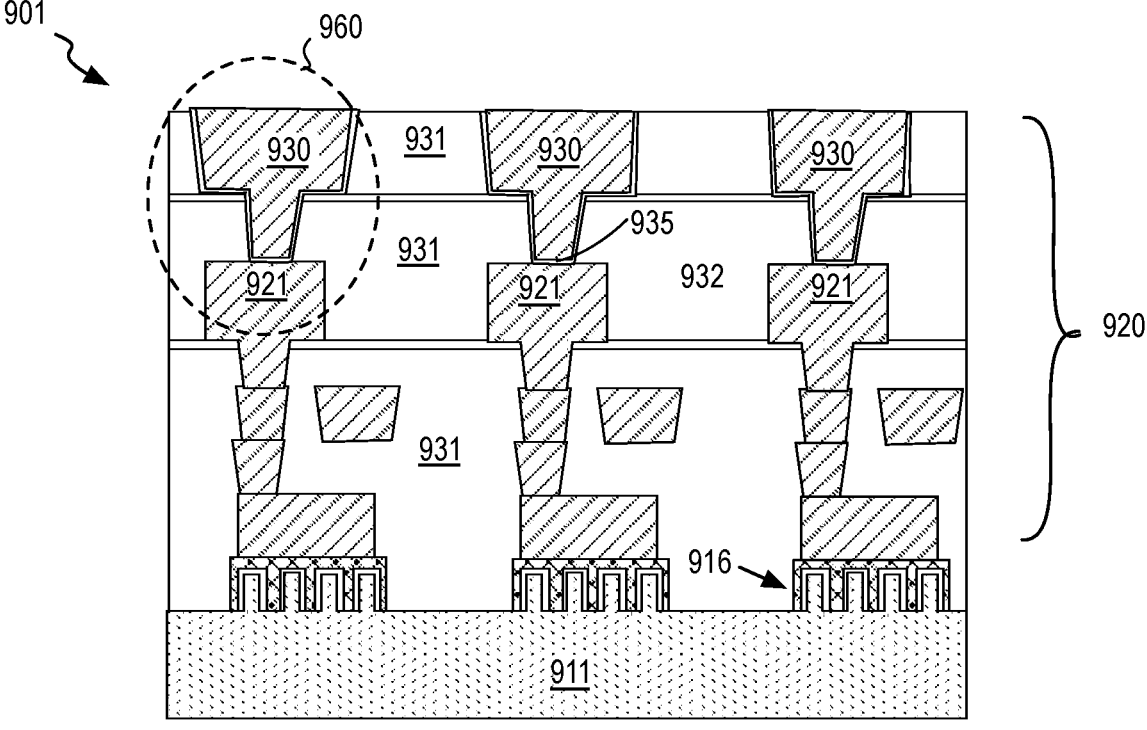

In the example illustrated in FIG. 9D, exemplary IC structure portion 901 further includes selector electrode metallization 930, which substantially fills trenches and via openings within dielectric materials 931, 932. The array of via selectors 960 are then substantially complete, for example substantially as they may be found within bit-cells of an OTP ROM array. Via selectors 960 may be combined with any OTP element (e.g., fuse or antifuse structure) that may either be similarly located exclusively within the interconnect metallization or at least partially within a device layer Although not illustrated, any number of additional levels of interconnect metallization features may be formed over electrode metallization 930. Following IC die singulation, packaging, and assembly into an electronic device, one or more OTP elements may be programmed for use in the field or during use in the field.

Figure 10A:
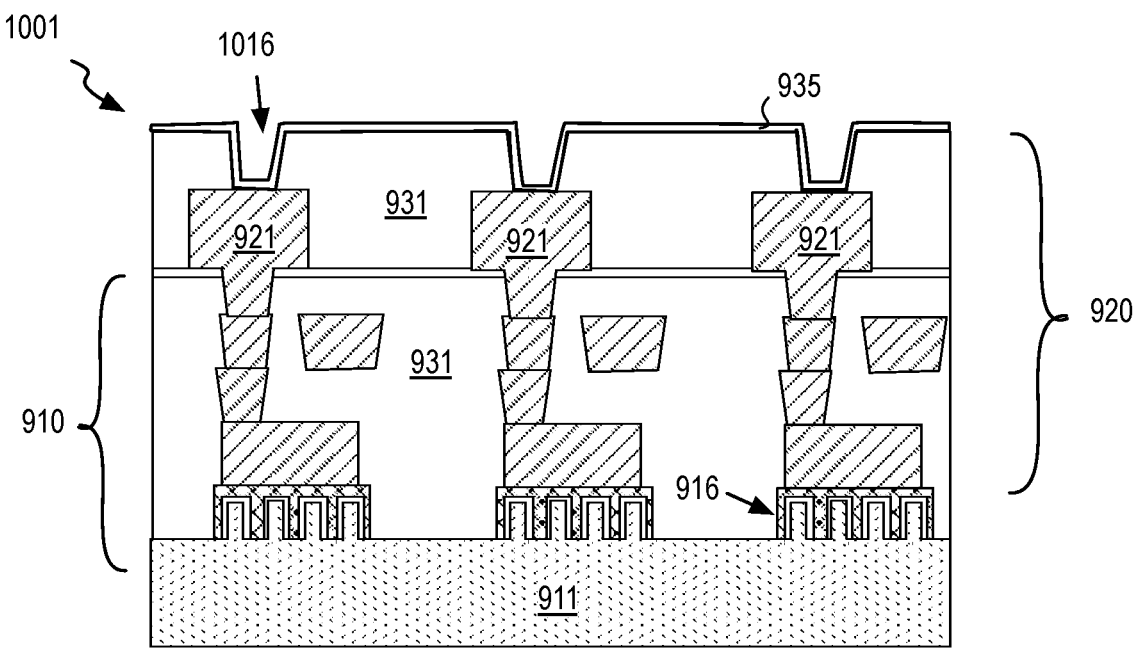
FIGS. 10A and 10B are cross-sectional views of an IC structure evolving as the methods illustrated in FIG. 8 are practiced in accordance with some alternative embodiments.
Figure 10B:
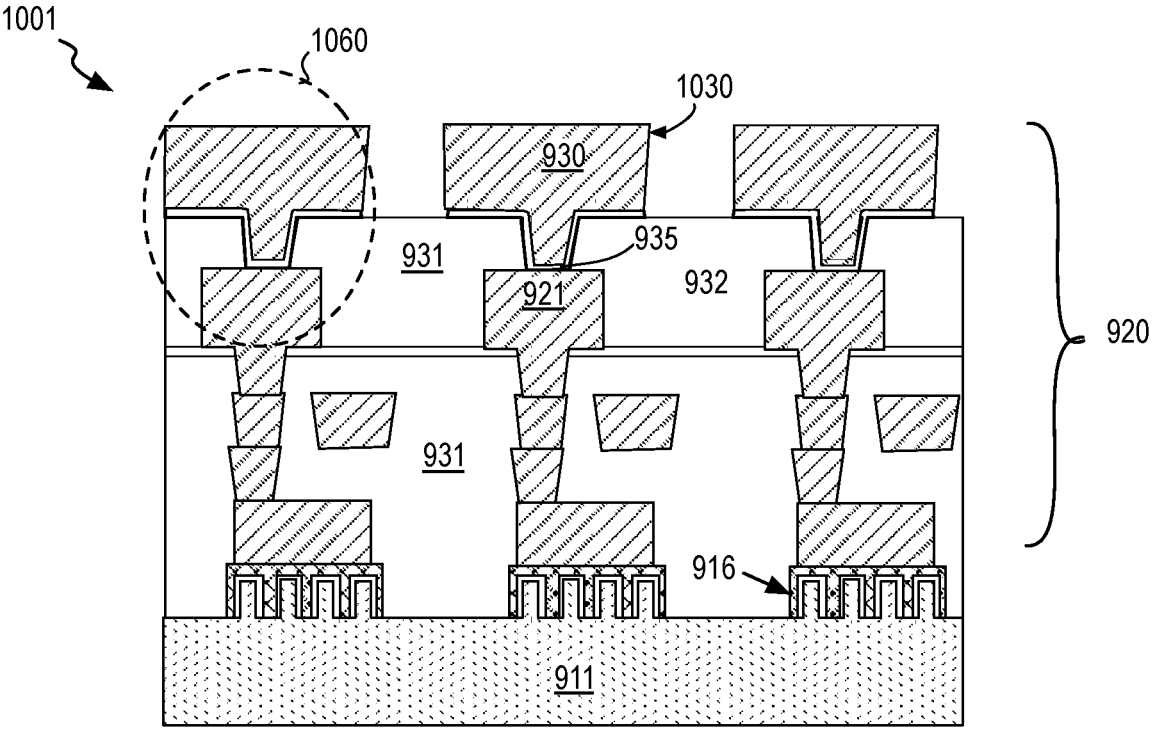

FIGS. 10A and 10B are cross-sectional views of an IC structure portion 1001 evolving as the methods 801 are practiced in accordance with some alternative embodiments. In FIG. 10A, IC structure portion 1001 includes semiconductor material layer 935 that has been deposited in a via opening 1016 that is not part of a dual-damascene electrode metallization structure. As further illustrated in FIG. 10B, electrode metallization 930 again at least partially fills an upper portion of via opening 1016, but electrode metallization 930 has been subtractively patterned to define electrode feature sidewall 1030 and thereby complete fabrication of via TVS MSM selector 1060. The etch process may be any suitable for the composition of electrode metallization 930 (e.g., W, Ru, Co, Mo, Ti or Pt). In the illustrated example, patterning on electrode metallization 930 also removes semiconductor material layer 935 from regions between adjacent features of electrode metallization 930. Alternatively, an etching of electrode metallization 930 may be sufficiently selective to stop on semiconductor material layer 935. Although not illustrated, additional dielectric material 931 may be subsequently deposited over electrode metallization 930 to complete fabrication of an IC device.

Figure 11A:
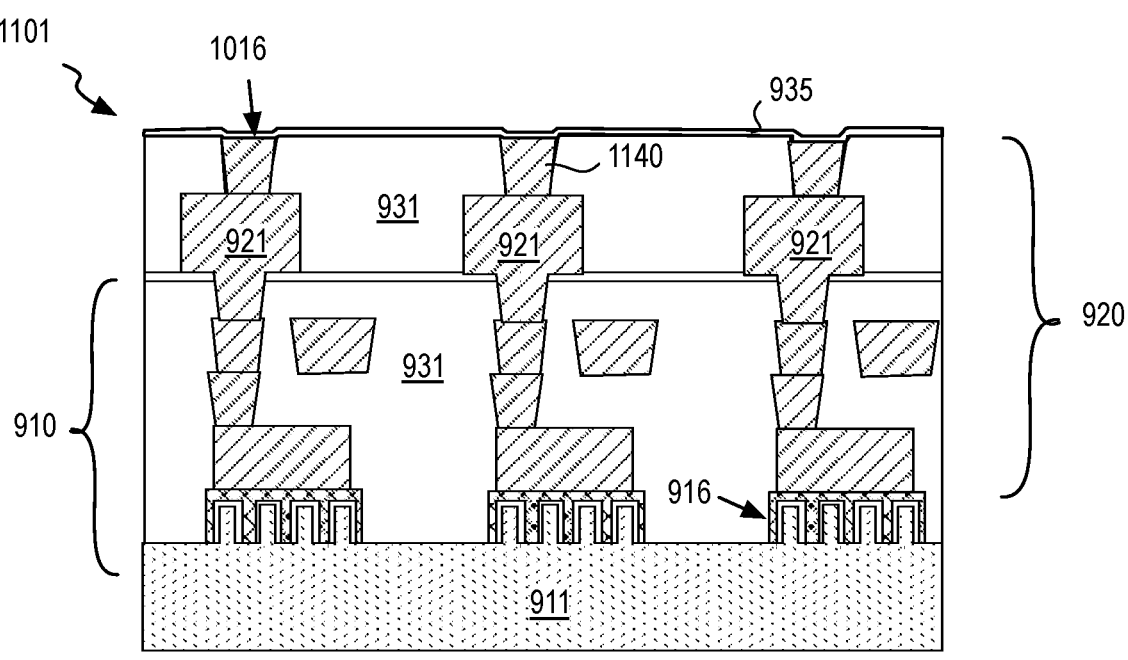
FIGS. 11A and 11B are cross-sectional views of an IC structure evolving as the methods illustrated in FIG. 8 are practiced in accordance with some alternative embodiments.
Figure 11B:
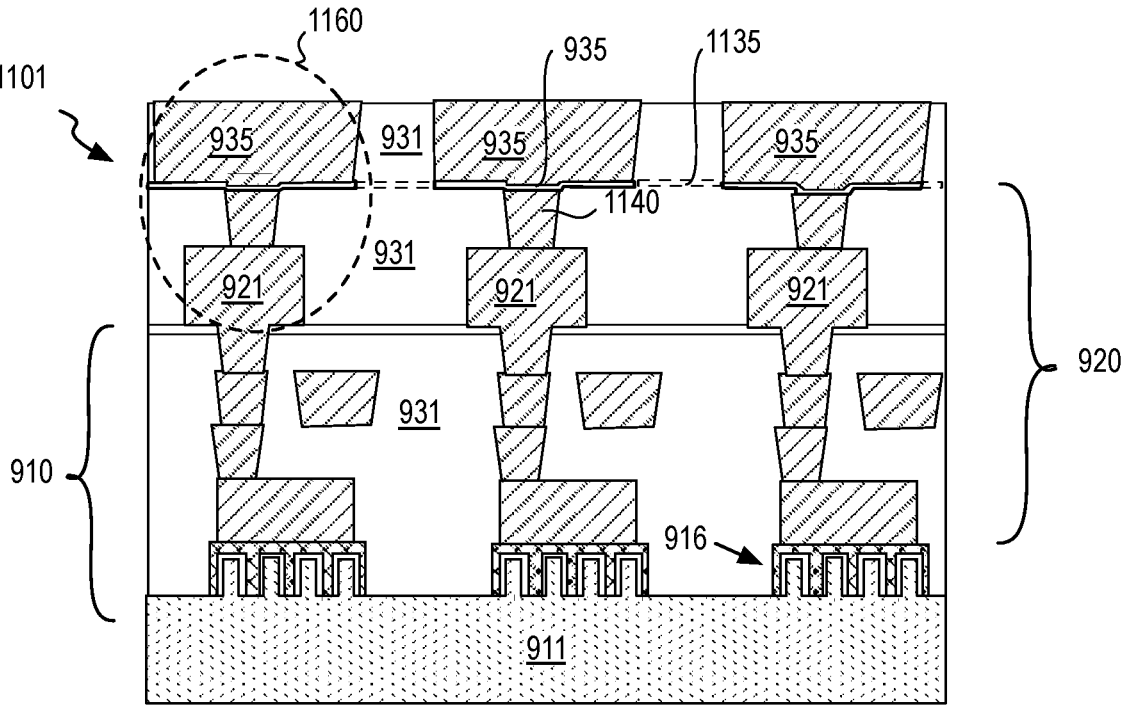

FIGS. 11A and 11B are cross-sectional views of an IC structure portion 1101 evolving as the methods 801 are practiced in accordance with some alternative embodiments where a via TVS MSM selector includes semiconductor material at a top interface rather than a bottom interface of a via. As shown in FIG. 11A, a via 1140 is formed after fabrication of selector electrode metallization 921. In this example, via metallization 1140 is in direct contact with electrode metallization 921. Via metallization 1140 may have been fabricated according to any techniques known to be suitable for interconnect vias, such as, but not limited to, a metal deposition followed by planarization with surrounding dielectric material 931. Following the planarization process, semiconductor material layer 935 may be deposited, for example according to any of the techniques described elsewhere herein, or according to any technique known to be suitable for a material layer of a particular composition and thickness.

As illustrated in FIG. 11B, IC structure portion 1101 further includes upper electrode metallization 930, completing via TVS MSM selector 1160. In this example, electrode metallization 930 has been defined through a subtractive etch process that has also removed semiconductor material layer 935 from between adjacent fuses. However, as illustrated by dashed line 1135, semiconductor material layer 935 may remain continuous within an array of selectors if the electrode etch process stops upon semiconductor material layer 935. Alternatively, where electrode metallization 930 is instead patterned according to a single-damascene planarization process, semiconductor material layer 935 will be continuous between selectors within an array (e.g., substantially as represented by dashed line 1135).

Any of the interconnect via TVS MSM selectors described above may be implemented in any integrated circuit of any IC die. Such an IC die may include logic and/or memory, for example. The IC die may include both logic and memory, for example where a logic circuit, such as a processor further includes embedded DRAM (eDRAM). Any of the via TVS MSM selectors described above may be implemented within one or more interconnect levels. For example, the IC structure portions described above may be implemented only within logic circuitry, only within memory array circuitry, or within both logic circuitry and memory array circuitry.

Figure 12:
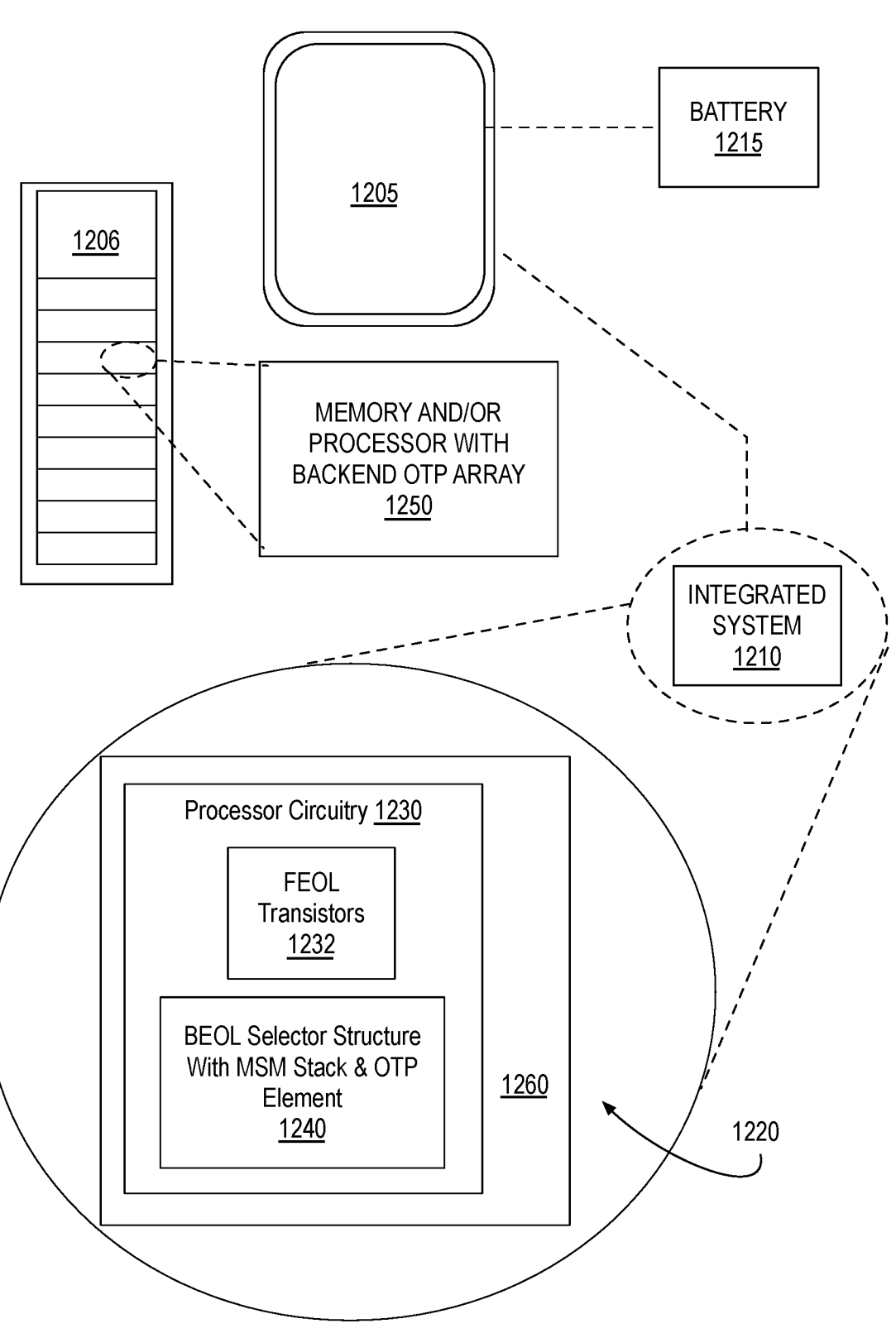
FIG. 12 illustrates a mobile computing platform and a data server machine employing an IC with an OTP memory array comprising MSM selectors, in accordance with some embodiments.

FIG. 12 illustrates a mobile computing platform 1205 and a data server computing platform 1206 employing an IC including a TVS MSM selector, for example within an OTP ROM, and as described elsewhere herein. The server platform 1206 may be any commercial server, for example including any number of high-performance computing platforms disposed within a rack and networked together for electronic data processing, which in the exemplary embodiment includes a microprocessor 1250 including a via TVS MSM selector, for example within an OTP ROM, and as described elsewhere herein.

The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215. At least one IC of chip-level or package-level integrated system 1210 including a via TVS MSM selector, for example within an OTP ROM, and as described elsewhere herein. In the example shown in expanded view 1220, integrated system 1210 includes microprocessor circuitry 1230 in a package 1260. The Microprocessor circuitry 1230 includes FEOL transistors 1232 and BEOL TVS-MSM selector structures 1240. In exemplary embodiments, a via TVS MSM selector is coupled to an OPT element, for example within an OTP ROM and as described elsewhere herein.

Figure 13:
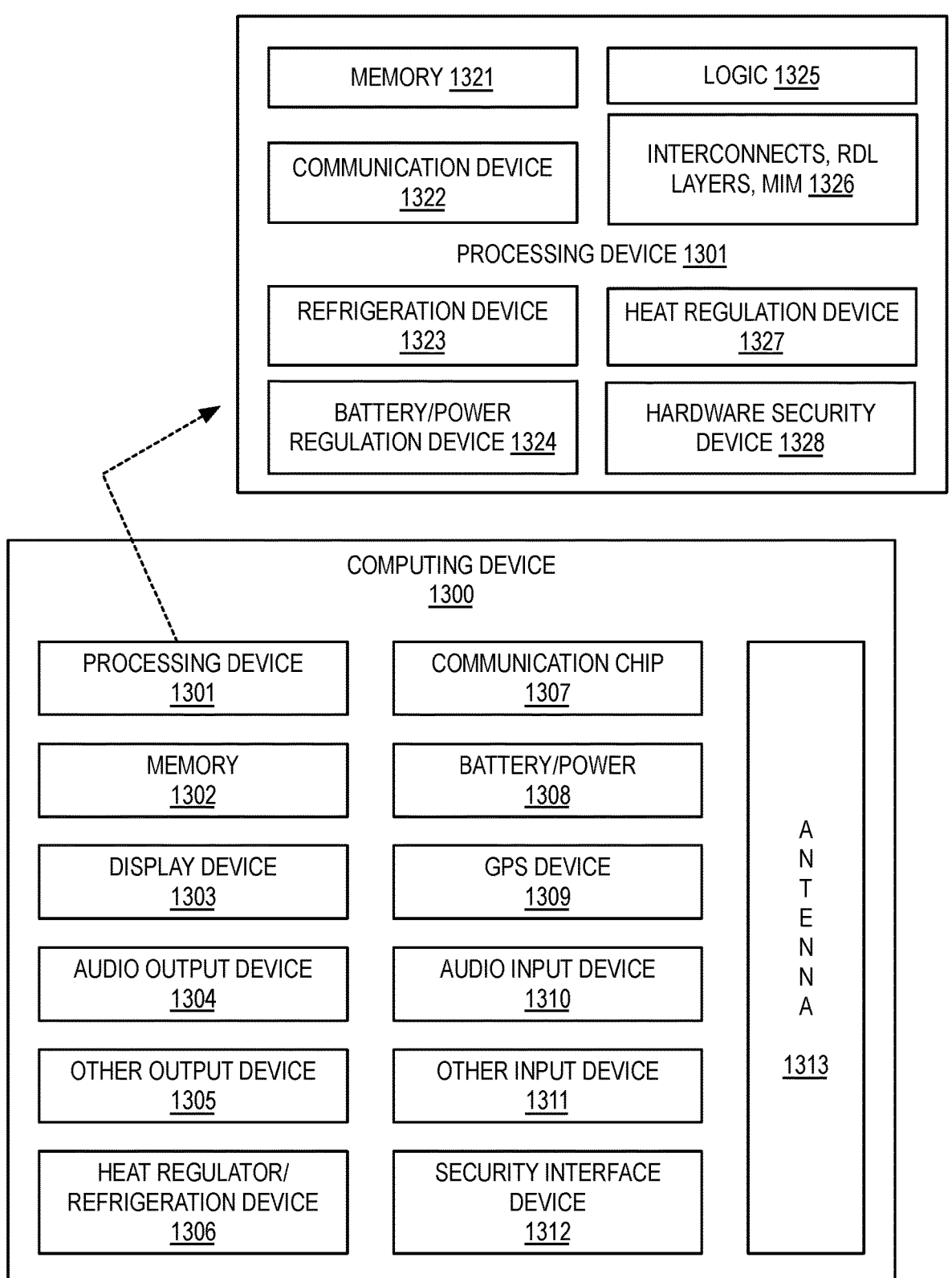
FIG. 13 is a functional block diagram of an electronic computing device, in accordance with some embodiments.

FIG. 13 is a block diagram of a cryogenically cooled computing device 1300 in accordance with some embodiments. For example, one or more components of computing device 1300 may include any of the devices or structures discussed elsewhere herein. A number of components are illustrated in FIG. 13 as included in computing device 1300, but any one or more of these components may be omitted or duplicated, as suitable for the application. In some embodiments, some or all of the components included in computing device 1300 may be attached to one or more printed circuit boards (e.g., a motherboard). In some embodiments, various ones of these components may be fabricated onto a single system-on-a-chip (SoC) die. Additionally, in various embodiments, computing device 1300 may not include one or more of the components illustrated in FIG. 13, but computing device 1300 may include interface circuitry for coupling to the one or more components. For example, computing device 1300 may not include a display device 1303, but may include display device interface circuitry (e.g., a connector and driver circuitry) to which display device 1303 may be coupled.

Computing device 1300 may include a processing device 1301 (e.g., one or more processing devices). As used herein, the term processing device or processor indicates a device that processes electronic data from registers and/or memory to transform that electronic data into other electronic data that may be stored in registers and/or memory. Processing device 1301 may include a memory 1321, a communication device 1322, a refrigeration/active cooling device 1323, a battery/power regulation device 1324, logic 1325, interconnects 1326 (i.e., Optionally including redistribution layers (RDL) or metal-insulator-metal (MIM) devices), a heat regulation device 1327, and a hardware security device 1328.

Processing device 1301 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1301 may include a memory 1302, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1321 includes memory that shares a die with processing device 1301. This memory may be used as cache memory and may include embedded dynamic random-access memory (eDRAM) or spin transfer torque magnetic random-access memory (STT-M RAM).

Computing device 1300 may include a heat regulation/refrigeration device 1306. Heat regulation/refrigeration device 1306 may maintain processing device 1301 (and/or other components of computing device 1300) at a predetermined low temperature during operation. This predetermined low temperature may be any temperature discussed elsewhere herein.

In some embodiments, computing device 1300 may include a communication chip 1307 (e.g., one or more communication chips). For example, the communication chip 1307 may be configured for managing wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a nonsolid medium.

Communication chip 1307 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1307 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1307 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1307 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1307 may operate in accordance with other wireless protocols in other embodiments. Computing device 1300 may include an antenna 1313 to facilitate wireless communications and/or to receive other wireless communications (such as AM or FM radio transmissions).

In some embodiments, communication chip 1307 may manage wired communications, such as electrical, OTPical, or any other suitable communication protocols (e.g., the Ethernet). As noted above, communication chip 1307 may include multiple communication chips. For instance, a first communication chip 1307 may be dedicated to shorter-range wireless communications such as Wi-Fi or Bluetooth, and a second communication chip 1307 may be dedicated to longer-range wireless communications such as GPS, EDGE, GPRS, CDMA, WiMAX, LTE, EV-DO, or others. In some embodiments, a first communication chip 1307 may be dedicated to wireless communications, and a second communication chip 1307 may be dedicated to wired communications.

Computing device 1300 may include battery/power circuitry 1308. Battery/power circuitry 1308 may include one or more energy storage devices (e.g., batteries or capacitors) and/or circuitry for coupling components of computing device 1300 to an energy source separate from computing device 1300 (e.g., AC line power).

Computing device 1300 may include a display device 1303 (or corresponding interface circuitry, as discussed above). Display device 1303 may include any visual indicators, such as a heads-up display, a computer monitor, a projector, a touchscreen display, a liquid crystal display (LCD), a light-emitting diode display, or a flat panel display, for example.

Computing device 1300 may include an audio output device 1304 (or corresponding interface circuitry, as discussed above). Audio output device 1304 may include any device that generates an audible indicator, such as speakers, headsets, or earbuds, for example.

Computing device 1300 may include an audio input device 1310 (or corresponding interface circuitry, as discussed above). Audio input device 1310 may include any device that generates a signal representative of a sound, such as microphones, microphone arrays, or digital instruments (e.g., instruments having a musical instrument digital interface (MIDI) output).

Computing device 1300 may include a global positioning system (GPS) device 1309 (or corresponding interface circuitry, as discussed above). GPS device 1309 may be in communication with a satellite-based system and may receive a location of computing device 1300, as known in the art.

Computing device 1300 may include another output device 1305 (or corresponding interface circuitry, as discussed above). Examples include an audio codec, a video codec, a printer, a wired or wireless transmitter for providing information to other devices, or an additional storage device.

Computing device 1300 may include another input device 1311 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1300 may include a security interface device 1312. Security interface device 1312 may include any device that provides security measures for computing device 1300 such as intrusion detection, biometric validation, security encode or decode, managing access lists, malware detection, or spyware detection. In some examples, security interface device 1312 comprises OTP ROM further including a via TVS-MSM selector, for example as described elsewhere herein.

Computing device 1300, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Notably, embodiments of the present invention are not limited to the specific examples described, but instead can be practiced with modification and alteration without departing from the scope of the appended claims. For example, the above embodiments may include specific combinations of features as further provided below.

In first examples, an integrated circuit (IC) comprises a device layer comprising a plurality of transistors, and an array of one-time programmable (OTP) bit-cells over the device layer. Individual ones of the OTP bit-cells comprise an OTP element comprising a fuse or an antifuse, and a selector, wherein the selector comprises a Schottky junction in electrical series with the OTP element.

In second examples, for any of the first examples a bidirectional diode comprises the Schottky junction.

In third examples, for any of the first through second examples a metal-semiconductor-metal (MSM) material stack comprises the Schottky junction.

In fourth examples, for any of the first through third examples a transient voltage suppression (TVS) diode comprises the Schottky junction and the TVS diode has a breakdown voltage less than a programming voltage to be applied to the OTP element by the IC.

In fifth examples, for any of the first through fourth examples the OTP element comprises a fuse that is to form an irreversible open circuit in response to an application of a voltage across the TVS diode and the fuse.

In sixth examples, for any of the first through fourth examples the breakdown voltage is less than a read voltage to be applied to the OTP element by the IC.

In seventh examples, for any of the sixth examples breakdown voltage is greater than one-half of the read voltage.

In eighth examples, for any of the fourth examples the TVS diode passes a transient current of at least 10 mA at a breakdown voltage below 2 V.

In ninth examples, for any of the first through eighth examples, the IC comprises a plurality of interconnect metallization levels over the device layer, wherein the interconnect metallization levels comprise both the OTP element and the selector.

In tenth examples, for any of the ninth examples the interconnect metallization levels comprise a first metallization feature, and a second metallization feature over the first metallization feature, and the Schottky junction comprises a semiconductor material layer within a via coupling together the first and second metallization features In eleventh examples, for any of the tenth examples the semiconductor material layer comprises silicon, germanium, or a compound of a metal and oxygen.

In twelfth examples, for any of the eleventh examples the via extends through a dielectric material between the first and second metallization features, and the semiconductor material layer is on a sidewall of the via, in direct contact with the dielectric material.

In thirteenth examples, for any of the twelfth examples the semiconductor material layer is at a bottom of the via structure, in direct contact with the first metallization feature.

In fourteenth examples, for any of the tenth through thirteenth examples at least one of the first metallization feature or the second metallization feature comprises at least one of Ti or Ni in direct contact with the semiconductor material layer.

In fifteenth examples, a computer platform comprises a power supply, and the IC of claim 1 coupled to the power supply through an IC die package interface.

In sixteenth examples, an integrated circuit (IC) comprises a plurality of interconnect metallization levels. The interconnect metallization levels comprise a plurality of fuses. Individual ones of the fuses comprise a first terminal coupled to a first circuit node. The interconnect metallization levels comprise a plurality of metal-semiconductor-metal (MSM) material stacks. Individual ones of the MSM material stacks comprise a metallization coupled to a second circuit node, and a semiconductor material layer separating the metallization from a second terminal of one of the fuses.

In seventeenth examples, for any of the sixteenth examples the metallization is a first metallization and individual ones of the fuses comprise a second metallization, and a fuse material layer separating the first metallization from a first circuit node. The fuse material layer comprises a metal and oxygen.

In eighteenth examples, a computer platform comprises a power supply, and the IC of any of the seventeenth examples coupled to the power supply through an IC die package interface.

In nineteenth examples, a method of fabricating a one-time programmable (OTP) bit-cell comprises forming a device layer, the device layer comprising a plurality of transistors, forming an OTP element over the device layer, and forming a selector over the device layer and in electrical series with the OTP element. Forming the selector comprises forming a Schottky junction.

In twentieth examples, forming the Schottky junction comprises forming a first metallization feature over the device layer, forming a semiconductor material over the first metallization feature, and forming a conductive via extending through a dielectric material, and in contact with a portion of the semiconductor material.

In twenty-first examples, for any of the twentieth examples forming the semiconductor material over the first metallization feature comprises forming a via opening through the dielectric material and exposing a portion of the first metallization feature at a bottom of the via opening. The method comprises depositing the semiconductor material within the via opening, over at least the bottom of the via, and the method comprises depositing metal within the via opening, in contact with the semiconductor material.

In twenty-second examples, for any of the twentieth through twenty-first examples forming the semiconductor material comprises depositing Si, or an alloy thereof, to a thickness of no more than 10 nm.

In twenty-third examples, for any of the twentieth through twenty-second examples forming the first metallization feature comprises depositing Ti, or a compound thereof, and forming the semiconductor material comprises depositing the Si, or alloy thereof, in contact with the Ti, or compound thereof.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC), comprising:
a device layer comprising a plurality of transistors; and
an array of one-time programmable (OTP) bit-cells over the device layer, wherein individual ones of the OTP bit-cells comprise:
an OTP element comprising a fuse or an antifuse; and
a selector, wherein the selector comprises a diode in electrical series with the OTP element, and wherein the diode comprises a Schottky junction and has a breakdown voltage less than a programming voltage to be applied to the OTP element by the IC.

2. The IC of claim 1, wherein a metal-semiconductor-metal (MSM) material stack comprises the Schottky junction.

3. The IC of claim 1, wherein the diode is operable as a transient voltage suppression (TVS) diode.

4. The IC of claim 1, wherein:
the OTP element comprises a fuse that is to form an irreversible open circuit in response to an application of a voltage across the diode and the fuse.

5. The IC of claim 1, wherein the breakdown voltage is less than a read voltage to be applied to the OTP element by the IC.

6. The IC of claim 5, wherein the breakdown voltage is greater than one-half of the read voltage.

7. The IC of claim 1, wherein the diode passes a transient current of at least 10 mA at a breakdown voltage below 2 V.

8. The IC of claim 1, further comprising:
a plurality of interconnect metallization levels over the device layer, wherein the interconnect metallization levels comprise both the OTP element and the selector.

9. A computer platform comprising:
a power supply; and
the IC of claim 1 coupled to the power supply through an IC die package interface.

10. An integrated circuit (IC), comprising:
a device layer comprising a plurality of transistors; and
an array of one-time programmable (OTP) bit-cells over the device layer, wherein individual ones of the OTP bit-cells comprise:
an OTP element comprising a fuse or an antifuse; and
a selector, wherein the selector comprises a Schottky junction in electrical series with the OTP element; and
a plurality of interconnect metallization levels over the device layer, wherein the interconnect metallization levels comprise both the OTP element and the selector, and wherein
the interconnect metallization levels comprise:
a first metallization feature; and
a second metallization feature over the first metallization feature; and the Schottky junction comprises a semiconductor material layer within a via coupling together the first and second metallization features.

11. The IC of claim 10, wherein the semiconductor material layer comprises silicon, germanium, or a compound of a metal and oxygen.

12. The IC of claim 11, wherein the via extends through a dielectric material between the first and second metallization features, and the semiconductor material layer is on a sidewall of the via, in direct contact with the dielectric material.

13. The IC of claim 12, wherein the semiconductor material layer is at a bottom of the via, in direct contact with the first metallization feature.

14. The IC of claim 10, wherein at least one of the first metallization feature or the second metallization feature comprises at least one of Ti or Ni in direct contact with the semiconductor material layer.

15. A method of fabricating a one-time programmable (OTP) bit-cell, the method comprising:

forming a device layer, the device layer comprising a plurality of transistors;

forming an OTP element over the device layer; and forming a selector over the device layer and in electrical series with the OTP element, wherein forming the selector comprises forming a Schottky junction and wherein forming the Schottky junction comprises:

forming a first metallization feature over the device layer;

forming a semiconductor material over the first metallization feature, wherein forming the semiconductor material comprises depositing Si, or an alloy thereof, to a thickness of no more than 10 nm; and forming a conductive via extending through a dielectric material, and in contact with a portion of the semiconductor material.

16. The method of claim 15, wherein forming the semiconductor material over the first metallization feature comprises:

forming a via opening through the dielectric material and exposing a portion of the first metallization feature at a bottom of the via opening;

depositing the semiconductor material within the via opening, over at least the bottom of the via; and depositing metal within the via opening, in contact with the semiconductor material.

17. The method of claim 15, wherein:

forming the first metallization feature comprises depositing Ti, or a compound thereof; and forming the semiconductor material comprises depositing the Si, or alloy thereof, in contact with the Ti, or compound thereof.

* * * * *